(12) United States Patent
Sugawara et al.

(10) Patent No.: US 7,408,188 B2
(45) Date of Patent: Aug. 5, 2008

(54) ORGANIC SEMICONDUCTOR MATERIAL, ORGANIC SEMICONDUCTOR STRUCTURE AND ORGANIC SEMICONDUCTOR APPARATUS

(75) Inventors: Shigeru Sugawara, Tokyo-To (JP); Hiroki Maeda, Tokyo-To (JP); Ken Tomino, Tokyo-To (JP); Masanao Matsuoka, Tokyo-To (JP)

(73) Assignee: Dai Nippon Printing Co., Ltd., Shinjuku-Ku (JP)

( * ) Notice: Subject to any disclaimer, the term of this patent is extended or adjusted under 35 U.S.C. 154(b) by 0 days.

(21) Appl. No.: 11/449,040

(22) Filed: Jun. 7, 2006

(65) Prior Publication Data

US 2007/0045614 A1    Mar. 1, 2007

(30) Foreign Application Priority Data

Jun. 8, 2005    (JP)    ............................... 2005-168029

(51) Int. Cl.
*H01L 51/30* (2006.01)
*C07D 333/10* (2006.01)
(52) U.S. Cl. ................. 257/40; 257/E51.029; 549/83
(58) Field of Classification Search ................. 257/40, 257/E51.029; 438/99; 528/380; 549/29, 549/41, 83–86
See application file for complete search history.

(56) References Cited

U.S. PATENT DOCUMENTS

| 6,445,126 B1* | 9/2002 | Arai et al. .................. 313/504 |
| 2003/0127642 A1* | 7/2003 | Halik et al. .................. 257/40 |
| 2005/0017311 A1* | 1/2005 | Ong et al. .................. 257/400 |

(Continued)

FOREIGN PATENT DOCUMENTS

JP    2003-221434    8/2003

(Continued)

OTHER PUBLICATIONS

Xia, C., et al, "A First Synthesis of Thiophene Dendrimers", Organic Letters, 2002, vol. 4 No. 12, 2067-2070.*

(Continued)

*Primary Examiner*—Bradley W. Baumeister
*Assistant Examiner*—Matthew W Such
(74) *Attorney, Agent, or Firm*—Burr & Brown

(57) ABSTRACT

An organic semiconductor material characterized by having a structure represented by chemical formula 1, the planarity of a main chain A1-X-A2 being disintegrated by steric hindrance between B1 and X and steric hindrance between B2 and X, the organic semiconductor material having a number average molecular weight of about 2,000 to about 200,000:

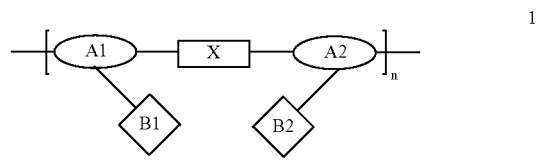

wherein A1, A2, B1, B2 and X each have a skeleton structure comprising L 6 π electron rings, M 8 π electron rings, N 10 π electron rings, O 12 π electron rings, P 14 π electron rings, Q 16 π electron rings, R 18 π electron rings, S 20 π electron rings, T 22 π electron rings, U 24 π electron rings, and V 26 π electron rings, wherein L, M, N, O, P, Q, R, S, T, U, and V are each an integer of 0 (zero) to 6 and L+M+N+O+P+Q+R+S+T+U+V=1 to 6; and B1 and B2 have an alkyl group.

7 Claims, 2 Drawing Sheets

U.S. PATENT DOCUMENTS

2006/0128969 A1 * 6/2006 Li et al. .................. 548/416

FOREIGN PATENT DOCUMENTS

WO    WO 9712882 A2 * 4/1997

OTHER PUBLICATIONS

Engelmann, G., et al., "Doped Polymers by Oxidative Polymerization 4. Oxidative Coupling of Methylated Oligothiophenes by FeCl3-6H20 as a Model Raction for the Oxidative Polymerization of Thiophene Derivatives", Macromolecules 1996, 29, 3370-3375. ☐☐* de Oliveira, M.A., et al., "Structure an Electronic Prooperties of Alkylthiophenes Coupled by Head-to-Tail and Head-to-Head Regioselectivity", J. Braz.Chem.Soc., vol. 15, No. 6 832-838, 2004. ☐☐*

* cited by examiner

ORGANIC SEMICONDUCTOR MATERIAL, ORGANIC SEMICONDUCTOR STRUCTURE AND ORGANIC SEMICONDUCTOR APPARATUS

TECHNICAL FIELD

The present invention relates to a liquid crystalline organic semiconductor material, which is highly stable under a film forming environment and, at the same time, can easily form a film, for example, by coating, an organic semiconductor structure and an organic semiconductor device.

BACKGROUND ART

Attention has recently been drawn to studies on organic semiconductor structures using an organic semiconductor material, and application of organic semiconductor structures to various devices has been expected. Devices utilizable, for example, in large-area flexible display devices, for example, thin-film transistors (also known as "organic TFTs"), luminescent elements, and solar cells are being studied for such application.

In order to utilize organic semiconductor structures on a practical level, the organic semiconductor layer formed of an organic semiconductor material should exhibit stable charge mobility in a wide service temperature range, and, at the same time, even thin film should be easily formed in a wide area. In particular, properties satisfying the following requirements are desired: the formation of a film by coating rather than film formation by conventional techniques such as vapor deposition is possible; properties in a film formation environment are stable; and stable high charge mobility can be exhibited in a wide service temperature range including room temperature (about −40 to +90° C.).

Regarding prior art documents relevant to the present invention, for example, non-patent document 1 describes an oligothiophene compound represented by the following chemical formula 3 as a nonlinear optical material. Non-patent possible and, thus, they are advantageous from the viewpoint of production. Further, the organic semiconductor layer formed using the organic semiconductor material is flexible and is highly mechanically stable and thus can be advantageously formed, for example, on a flexible plastic substrate.

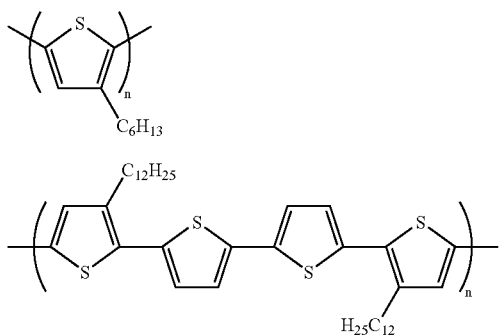

a b

The organic semiconductor layer formed of polythiophenes such as poly(3-hexylthiophene) represented by chemical formula a is disadvantageously likely to undergo oxidation by oxygen in the air exposed during film formation. TFT comprising an oxidized organic semiconductor layer suffers from a problem that the on/off ratio is reduced due to a rise in off current. To overcome this problem, for example, patent document 1 proposes poly[5,5'-bis(3-dodecyl-2-thienyl)-2,2'-dithiophene] represented by chemical formula b. The claimed advantage of this polymer material is that, since the polymer material is soluble in organic solvents, film formation using various coating and printing means is possible and, at the same time, the polymer material is less likely to undergo oxidation and can prevent a problem with oxidation.

Patent document 1: Japanese Patent Laid-Open No. 221434/2003

SUMMARY OF THE INVENTION

Problems to be Solved by the Invention

The present invention has been made with a view to provide a polymer material which can solve the above problems of the prior art, and an object of the present invention is to provide an organic semiconductor material that is highly stable under a film forming environment and, at the same time, can easily form a film, for example, by coating. Another object of the present invention is to provide an organic semiconductor structure and organic semiconductor device comprising an organic semiconductor layer formed of the organic semiconductor material.

Means for Solving the Problems

The above object of the present invention can be attained by an organic semiconductor material characterized by having a structure represented by chemical formula 1, the planarity of a main chain A1-X-A2 being disintegrated by steric hindrance between B1 and X; and steric hindrance between B2 and X, said organic semiconductor material having a number average molecular weight of about 2,000 to about 200,000:

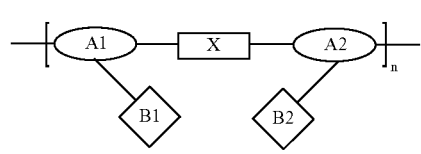

1 wherein A1, A2, B1, B2 and X each have a skeleton structure comprising L 6 π electron rings, M 8 π electron rings, N 10 π electron rings, O 12 π electron rings, P 14 π electron rings, Q 16 π electron rings, R 18 π electron rings, S 20 π electron rings, T 22 π electron rings, U 24 π electron rings, and V 26 π electron rings, wherein L, M, N, O, P, Q, R, S, T, U, and V are each an integer of 0 (zero) to 6 and L+M+N+O+P+Q+R+S+T+U+V=1 to 6; and B1 and B2 have an alkyl chain.

In the organic semiconductor material having the above structure according to the present invention, since A1, A2, B1, B2 and X in chemical formula 1 have the above π electron ring-containing skeleton structure, the planarity of A1-X-A2 as the main chain is disintegrated due to the steric hindrance, based on the presence of the aromatic ring located on the side chain part, between B1 and X and between B2 and X. The organic semiconductor material having this structure is advantageously less likely to undergo oxidation even under the atmospheric environment at the time of film formation, has excellent stability in the course of production and, at the same time, can form an organic semiconductor layer which can prevent a rise in off current to realize a large on/off ratio.

The low susceptibility to oxidation of the organic semiconductor material according to the present invention is considered attributable to a lowering in ionization potential based on the loss of the planarity of the main chain part. Further, since B1 and B2 have an alkyl chain, the organic semiconductor material according to the present invention has at least a certain level of solubility in solvents and consequently can realize film formation by various coating or printing means, which is advantageous from the viewpoint of production. Further, the organic semiconductor material according to the present invention has π conjugated system extended structure and thus is advantageous for narrowing the band gap and, at the same time, can suppress a rise in ionization potential.

When the organic semiconductor layer is formed using the organic semiconductor material according to the present invention which is a polymer material, since B1 and B2 in the side chain part have an alkyl chain, due to interaction between the alkyl chain in B1 and B2 in the side chain part and the same alkyl chain in an adjacent polymer material, the polymer materials are regularly aligned in a main chain oriented form. Therefore, intramolecular conduction is likely to occur. Further, B1 and B2 in the side chain part take a form inclined toward the main chain, and, hence, a packing structure, in which superimposition of π conjugated system of polymer chains on top of each other is spread multidimensionally, is formed. By virtue of this, the organic semiconductor layer has such a structure that charges are likely to cause hopping conduction between polymer chains and the structure is advantageous from the viewpoint of improving the charge mobility. Further, the organic semiconductor layer is flexible and highly mechanically durable and thus can be advantageously formed, for example, on a flexible plastic substrate.

In the organic semiconductor material according to the present invention, preferably, the alkyl chain in B1 and B2 is an alkyl group having 4 to 20 carbon atoms.

The above object of the present invention can be attained by an organic semiconductor material characterized by being represented, for example, by chemical formula 2 wherein R1 and R2 each represent an alkyl group having 4 to 20 carbon atoms, said organic semiconductor material having number average molecular weight of about 2,000 to about 200,000:

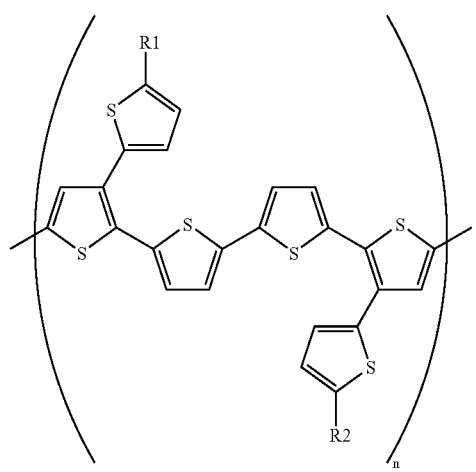

2

This structure is an specific example of chemical formula 1. In this structure, the planarity of the main chain is disintegrated due to the steric hindrance between bithiophene located at the position of X in the main chain and 2-dodecylthiophene located at the position of B1 and the position of B2 in the side chain part. The polymer material having this structure is advantageously less likely to undergo oxidation even under the atmospheric environment at the time of film formation, has excellent stability in the course of production and, at the same time, can form an organic semiconductor layer which can prevent a rise in off current to realize a large on/off ratio. Further, since R1 and R2 in chemical formula 2 each represent an alkyl group having 4 to 20 carbon atoms, the organic semiconductor material is soluble in solvents and can form a film by various coating and printing means. When the organic semiconductor layer is formed using this organic semiconductor material, due to interaction between the alkyl chain in the side chain part and the alkyl chain in an adjacent organic semiconductor material, the polymer materials are regularly aligned in a main chain oriented form. Therefore, intramolecular conduction is likely to occur. Further, 2-dodecylthiophene in the side chain part takes a form inclined toward the main chain, and, hence, a packing structure, in which superimposition of π conjugated system of polymer chains on top of each other is spread multidimensionally, is formed. By virtue of this, the organic semiconductor layer has such a structure that charges are likely to cause hopping conduction between polymer chains and the structure is advantageous from the viewpoint of improving the charge mobility.

The above object of the present invention is attained by an organic semiconductor structure characterized by comprising an organic semiconductor layer formed of the organic semiconductor material according to the present invention.

In the organic semiconductor structure according to the present invention, the organic semiconductor layer is less likely to undergo oxidation under a film forming environment and is excellent in stability during film formation. An organic semiconductor structure comprising an organic semiconductor layer, which can prevent a rise in off current to realize a large on/off ratio, can be provided. Further, in the organic semiconductor structure according to the present invention, since the organic semiconductor materials are regularly aligned in a main chain oriented form, intramolecular conduction is likely to occur. Further, a packing structure, in which superimposition of π conjugated system of polymer chains on top of each other is spread multidimensionally, is formed. Therefore, in the organic semiconductor layer, charges are likely to cause hopping conduction between the polymer chains. This is advantageous from the viewpoint of improving the charge mobility. Further, in the organic semiconductor structure according to the present invention, since the organic semiconductor layer is flexible and highly mechanically durable, an organic semiconductor structure provided on a flexible plastic substrate can be realized.

The above object of the present invention can be attained by an organic semiconductor device characterized by comprising at least a substrate, a gate electrode, a gate insulating layer, an organic semiconductor layer, a drain electrode, and a source electrode, said organic semiconductor layer being formed of the organic semiconductor material according to the present invention.

According to the present invention, since an organic semiconductor layer is formed using an organic semiconductor material, which is stable under a film forming environment and, at the same time, can easily form a film, for example, by coating, an organic semiconductor device can be realized in which film formation by coating rather than conventional film formation by vapor deposition and the like is possible and, at the same time, stability of properties under a film forming environment is excellent.

Further, according to the present invention, there is provided use of use of the above organic semiconductor structure according to the present invention, as an organic transistor, an organic EL element, an organic electronic device, or an organic solar cell.

According to the organic semiconductor material according to the present invention, the planarity of the main chain is disintegrated based on the presence of the aromatic ring located on the side chain part, resulting in lowered ionization potential. Accordingly, an organic semiconductor layer, which is less likely to undergo oxidation and stable even under a film forming environment and, at the same time, can prevent a rise in off current to realize a large on/off ratio, can be formed. Further, the organic semiconductor material according to the present invention is soluble in solvents and thus can easily realize the formation of an organic semiconductor layer by various coating and printing means. When the organic semiconductor layer is formed using the organic semiconductor material according to the present invention, since the polymer materials are regularly aligned in a main chain oriented form, intramolecular conduction is likely to occur. Further, since the side chain part take a form inclined toward the main chain, a packing structure, in which superimposition of π conjugated system of polymer chains on top of each other is spread multidimensionally, is formed. Therefore, in the organic semiconductor layer, charges are likely to cause hopping conduction between the polymer chains. This is advantageous from the viewpoint of improving the charge mobility.

The organic semiconductor structure and organic semiconductor device according to the present invention comprises an organic semiconductor layer that can prevent a rise in off current to realize a large on/off ratio. Further, since the organic semiconductor materials are regularly aligned in a main chain oriented form, intramolecular conduction is likely to occur. Further, since a packing structure, in which superimposition of π conjugated system of polymer chains on top of each other is spread multidimensionally, is formed, in the organic semiconductor layer, charges are likely to cause hopping conduction between the polymer chains. This is advantageous from the viewpoint of improving the charge mobility. Further, since the organic semiconductor layer is flexible and, at the same time, is highly mechanically durable, the organic semiconductor structure and organic semiconductor device are particularly useful, for example, for large-area display devices, for example, large-area image sensors, electronic papers, and other display media, comprising an organic semiconductor structure or an organic semiconductor device provided on a flexible plastic substrate.

DESCRIPTION OF REFERENCE CHARACTERS

Figure 1:
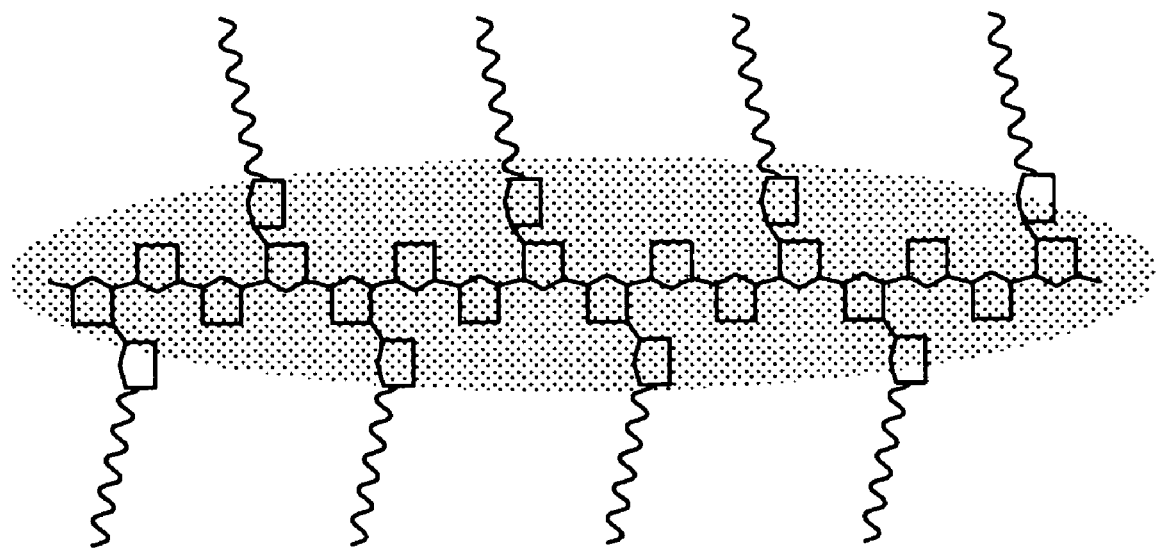
FIG. 1 is a typical diagram showing an extended form of π conjugated system for the organic semiconductor material according to the present invention.

101: organic semiconductor device,
11: substrate,
12: gate electrode,
13: gate insulating layer,
14: polymeric organic semiconductor layer,
15: drain electrode, and
16: source electrode.

DETAILED DESCRIPTION OF THE INVENTION

The organic semiconductor material, organic semiconductor structure, and organic semiconductor device according to the present invention will be described.

(Organic Semiconductor Material)

The organic semiconductor material is characterized by having a structure represented by chemical formula 1, the planarity of a main chain A1-X-A2 being disintegrated by steric hindrance between B1 and X and steric hindrance between B2 and X, the organic semiconductor material having a number average molecular weight of about 2,000 to about 200,000, wherein A1, A2, B1, B2 and X each have a skeleton structure comprising L 6 π electron rings, M 8 π electron rings, N 10 π electron rings, O 12 π electron rings, P 14 π electron rings, Q 16 π electron rings, R 18 π electron rings, S 20 π electron rings, T 22 π electron rings, U 24 π electron rings, and V 26 π electron rings, wherein L, M, N, O, P, Q, R, S, T, U, and V are each an integer of 0 (zero) to 6 and L+M+N+O+P+Q+R+S+T+U+V=1 to 6; and B1 and B2 have an alkyl chain.

The skeleton structures of A1, A2, B1, B2 and X in Chemical Formula 1 will be first described. The organic semiconductor material according to the present invention is a polymer material that has a number average molecular weight of about 2,000 to 200,000 and a weight average molecular weight of about 4,000 to 500,000 and comprises repeating units comprising a main chain part of A1-X-A2 and a side chain part of B1 and B2 each having an alkyl chain. In chemical formula 1, n represents the degree of polymerization and is about 4 to 500.

In chemical formula 1, A1, A2, B1, B2, and X each are selected from the group consisting of L 6 π electron rings, M 8 π electron rings, N 10 π electron rings, O 12 π electron rings, P 14 π electron rings, Q 16 π electron rings, R 18 π electron rings, S 20 π electron rings, T 22 π electron rings, U 24 π electron rings, and V 26 π electron rings. In the organic semiconductor material according to the present invention, L, M, N, O, P, Q, R, S, T, U, and V are each an integer of 0 (zero) to 6 and L+M+N+O+P+Q+R+S+T+U+V=1 to 6. The π electron aromatic rings of A1, A2, B1, B2, and X may be the same or different. Further, A1, A2, B1, B2 and X in chemical formula 1 each may have a flexuous chain structure or alternatively may have a functional group.

Specifically, examples of 6 π electron rings include benzene, furan, thiophene, pyrrole, 2H-pyran, 4H-thiopyran, pyridine, oxazole, isoxazole, thiazole, isothiazole, furazane, imidazole, pyrazole, pyrazine, pyrimidine, pyridazine and tropolone rings. 8 π electron rings include, for example, pentalene, indene, indolizine, and 4H-quinolizine rings. 10 π electron rings include, for example, naphthalene, azulene, benzofuran, isobenzofuran, 1-benzothiophene, 2-benzothiophene, indole, isoindole, 2H-chromene, 1H-2-benzopyran, quinoline, isoquinoline, 1,8-naphthyridine, benzimidazole, 1H-indazole, benzoxazole, benzothiazole, quinoxaline, quinazoline, cinnoline, pteridine, purine, and phthalazine rings. 12 π electron rings include, for example, heptalene, biphenylene, as-indacene, s-indacene, acenaphthylene, fluorene, and phenalene rings. 14 π electron rings include, for example, phenanthrene, anthracene, carbazole, xanthene, acridine, phenanthridine, perimidine, 1,10-phenanthroline, phenazine, phenarsazine, and tetrathiafulvalene rings. 16 π electron rings include, for example, fluoranthene, acephenanthrylene, aceanthrylene, pyrene, thianthrene, phenoxathiine, phenoxazine, and phenothiazine rings. 18 π electron rings include, for example, triphenylene, chrysene, naphthacene, and pleiadene rings. 20 π electron rings include, for example, perylene ring. 22 π electron rings include, for example, picene, pentaphene, and pentacene rings. 24 π electron rings include, for example, tetraphenylene and coronene rings. 26 π electron rings include, for example, hexaphene, hexacene, and rubicene rings.

For example, an organic semiconductor material having a structure represented by chemical formula 2 may be mentioned as a skeleton structure as a part of the structures of these π electron rings. Preferably, the organic semiconductor material represented by chemical formula 2 has a number average molecular weight of about 2,000 to 200,000 and a weight average molecular weight of about 4,000 to 500,000. In the organic semiconductor material represented by chemical formula 2, the planarity of the main chain is disintegrated due to the steric hindrance between bithiophene located at the position of X in the main chain and 2-dodecylthiophene located at the position of B1 and the position of B2 in the side chain part.

In chemical formula 2, R1 an R2 respectively represent alkyl groups having 4 to 20 carbon atoms (hereinafter referred to as "C") that are connected respectively to B1 and B2 and may be the same or different. The alkyl group may be of straight chain or branched chain type. For example, C4 to C12 alkyl groups are butyl, pentyl, hexyl, heptyl, octyl, nonyl, decyl, undecyl, and dodecyl, respectively, and these alkyl groups or their isomers are preferred.

In the organic semiconductor material having the above structure, since A1, A2, B1, B2 and X in chemical formula 1 have the above π electron ring-containing skeleton structure, the planarity of A1-X-A2 as the main chain is disintegrated due to the steric hindrance, based on the presence of the aromatic ring located on the side chain part, between B1 and X and between B2 and X. The organic semiconductor material having this structure is advantageously less likely to undergo oxidation even under the atmospheric environment at the time of film formation, has excellent stability in the course of production and, at the same time, can form an organic semiconductor layer which can prevent a rise in off current to realize a large on/off ratio. The low susceptibility to oxidation of the organic semiconductor material is considered attributable to a lowering in ionization potential based on the loss of the planarity of the main chain part. Further, since B1 and B2 have an alkyl chain, the organic semiconductor material has at least a certain level of solubility in solvents and consequently can realize film formation by various coating or printing means which is advantageous from the viewpoint of production.

FIG. 1 is a typical diagram showing an extended form of π conjugated system for the organic semiconductor material according to the present invention. In FIG. 1, the gray part shows an extended part of π conjugated system. The organic semiconductor material according to the present invention is advantageous for narrowing the band gap and, at the same time, can suppress a rise in ionization potential.

In the organic semiconductor material according to the present invention, due to interaction between the alkyl chain in B1 and B2 in the side chain part and the same alkyl chain in an adjacent organic semiconductor material, each organic semiconductor material is regularly self-aligned in a main chain oriented form to provide a high-order molecular structure alignment that is likely to cause intramolecular conduction. Further, in the regularly self-aligned organic semiconductor material, B1 and B2 in the side chain part take a form inclined toward the main chain, and, hence, a packing structure, in which superimposition of π conjugated system of polymer chains on top of each other is spread multidimensionally, is formed. By virtue of this, the organic semiconductor layer has such a structure that charges are likely to cause hopping conduction between polymer chains and charges. This is advantageous from the viewpoint of efficiently transferring charges.

As is apparent from chemical formulae 1 and 2, the organic semiconductor material has an alkyl chain on its side chain part. Therefore, the solubility of the organic semiconductor material in solvents such as toluene, xylene, tetralin, mesitylene, chlorobenzene, dichloroethane, and tetrahydrofuran is at least not less than 0.1% by weight. An organic semiconductor layer utilizable, for example, in large-area flexible display devices can easily be formed by dissolving the organic semiconductor material in the solvent to prepare a coating liquid and then coating the coating liquid onto a predetermined substrate such as a plastic or glass substrate optionally with various films formed thereon. In this case, various coating and printing methods such as spin coating, solution casting, dip coating, screen printing, stamp printing, and jet printing may be applied.

(Organic Semiconductor Structure)

Next, the organic semiconductor structure will be described. The organic semiconductor structure according to the present invention comprises an organic semiconductor layer formed of the above organic semiconductor material.

In the organic semiconductor layer in the organic semiconductor structure according to the present invention, due to interaction between the alkyl chain in B1 and B2 in the side chain part and the same alkyl chain in an adjacent organic semiconductor material, each organic semiconductor material is regularly self-aligned in a main chain oriented form. Accordingly, intramolecular conduction is likely to occur. Further, in the organic semiconductor layer, B1 and B2 in the side chain part take a form inclined toward the main chain, and, hence, a packing structure, in which superimposition of n conjugated system of polymer chains on top of each other is spread multidimensionally, is formed. By virtue of this, the organic semiconductor layer has such a structure that charges are likely to cause hopping conduction between polymer chains and charges. This is advantageous from the viewpoint of improving the charge mobility.

As described above in connection with the organic semiconductor material, the organic semiconductor layer formed of the organic semiconductor material according to the present invention is less likely to undergo even under the atmospheric environment at the time of film formation and is excellent in stability in the course of production. Therefore, a rise in off current can be prevented, and, thus, an organic semiconductor structure having a large on/off ratio can be provided. Further, since the organic semiconductor layer is flexible and mechanically durable, an organic semiconductor structure provided on a flexible plastic substrate can be realized.

(Organic Semiconductor Structure)

Next, the organic semiconductor device will be described.

Figure 2:
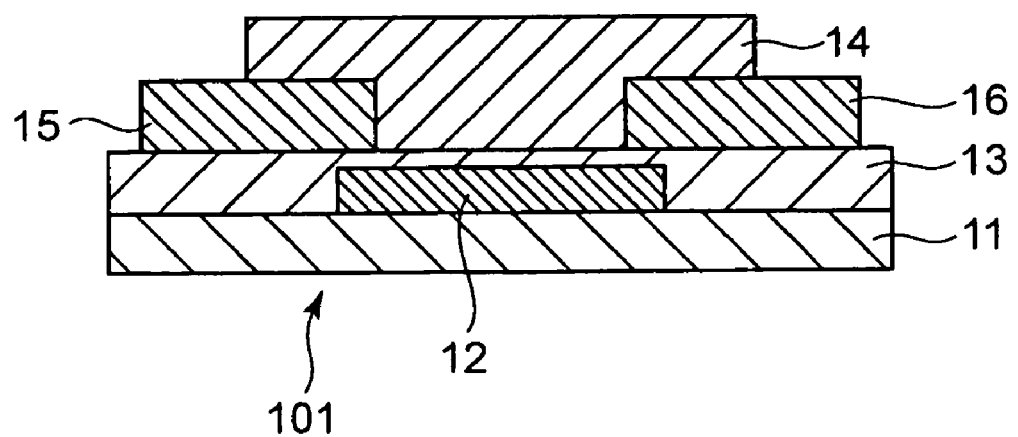
FIG. 2 is a cross-sectional view showing one embodiment of the organic semiconductor device according to the present invention.

An organic semiconductor device 101 according to the present invention, for example, as shown in FIG. 2, comprises at least a substrate 11, a gate electrode 12, a gate insulating layer 13, an organic semiconductor layer 14, a drain electrode 15, and a source electrode 16. In this organic semiconductor device 101, the organic semiconductor layer 14 is formed of the organic semiconductor material constituting the organic semiconductor structure according to the present invention.

Examples of the construction include a reversed stagger structure (not shown) comprising a substrate 11 and a gate electrode 12, a gate insulating layer 13, an organic semiconductor layer 14, a drain electrode 15 and a source electrode 16, and a protective film 17 provided in that order on the substrate 11, or a coplanar structure (see FIG. 2) comprising a substrate 11 and a gate electrode 12, a gate insulating layer 13, a drain electrode 15 and a source electrode 16, an organic semiconductor layer 14, and a protective film (not shown) provided in that order on the substrate 11. The organic semiconductor device 101 having the above construction is operated in either an storage state or a deficiency state depending upon the polarity of the voltage applied to the gate electrode 12. Members for constituting the organic semiconductor device will be described in detail.

(Substrate)

The substrate 11 may be selected form a wide range of insulating materials. Examples of such materials include inorganic materials such as glasses and alumina sinters, polyimide films, polyester films, polyethylene films, polyphenylene sulfide films, poly-p-xylene films and other various insulating materials. The use of a film- or sheet-shaped insulating resin substrate formed of a polymer compound is very useful because a lightweight and flexible organic semiconductor device can be prepared. The thickness of the substrate 11 applied in the present invention is about 25 µm to 1.5 mm.

(Gate Electrode)

The gate electrode 12 is preferably an electrode formed of an organic material such as polyaniline or polythiophene, or an electrode formed by coating an electrically conductive ink. These electrodes can be formed by coating an organic material or an electrically conductive ink and thus is advantageous in that the electrode formation process is very simple. Specific methods usable for the coating include spin coating, casting, pulling-up, and transfer and ink jet methods.

When a metal film is formed as the electrode, a conventional vacuum film formation method may be used for the metal film formation. Specifically, a mask film formation method or a photolithographic method may be used. In this case, materials usable for electrode formation include metals such as gold, platinum, chromium, palladium, aluminum, indium, molybdenum, and nickel, alloys using these metals, and inorganic materials such as polysilicon, amorphous silicone, tin oxide, indium oxide, and indium tin oxide (ITO). These materials may be used in a combination of two or more.

The film thickness of the gate electrode is preferably about 50 to 1000 nm although the film thickness varies depending upon the electric conductivity of the material for electrode. The lower limit of the thickness of the gate electrode varies depending upon the electric conductivity of the electrode material and the adhesive strength between the gate electrode and the underlying substrate. The upper limit of the thickness of the gate electrode should be such that, when a gate insulating layer and a source-drain electrode pair, which will be described later, are provided, the level difference part between the underlying substrate and the gate electrode is satisfactorily covered for insulation by the gate insulating layer and, at the same time, an electrode pattern formed thereon is not broken. In particular, when a flexible substrate is used, the balance of stress should be taken into consideration.

(Gate Insulating Layer)

As with the gate electrode 12, the gate insulating layer 13 is preferably formed by coating an organic material. Organic materials usable herein include polychloropyrene, polyethylene terephthalate, polyoxymethylene, polyvinyl chloride, polyvinylidene fluoride, cyanoethylpullulan, polymethyl methacrylate, polysulfone, polycarbonate, and polyimide. Specific examples of methods usable for coating include spin coating, casting, pulling-up, and transfer and ink jet methods. A conventional pattern process such as CVD may also be used. In this case, inorganic materials such as $SiO_2$, SiNx, and $Al_2O_3$ are preferred. These materials may be used in a combination of two or more.

Since the charge mobility of the organic semiconductor device depends upon the field strength, the thickness of the gate insulating layer is preferably about 50 to 300 nm. In this case, the withstand voltage is preferably not less than 2 MV/cm.

(Drain Electrode and Source Electrode)

The drain electrode 15 and the source electrode 16 are preferably formed of a metal having a large work function. The reason for this is that, in the organic semiconductor material according to the present invention, since carriers for transferring charges are holes, these electrodes should be in ohmic contact with the organic semiconductor layer 14. The work function referred to herein is an electric potential difference necessary for withdrawing electrons in the solid to the outside of the solid and is defined as a difference in energy between a vacuum level and a Fermi level. The work function is preferably about 4.6 to 5.2 eV. Such materials include gold, platinum, and transparent electrically conductive films (for example, indium tin oxide and indium zinc oxide). The transparent electrically conductive film may be formed by sputtering or electron beam (EB) vapor deposition. The thickness of the drain electrode 15 and the source electrode 16 applied in the present invention is about 50 nm.

(Organic Semiconductor Layer)

The organic semiconductor layer 14 is a layer formed of the organic semiconductor material according to the present invention.

(Interlayer Insulating Layer)

An interlayer insulating layer is preferably provided in the organic semiconductor device 101. In forming the drain electrode 15 and the source electrode 16 on the gate insulating layer 13, the interlayer insulating layer is formed to prevent the contamination of the surface of the gate electrode 12. Accordingly, the interlayer insulating layer is formed on the gate insulating layer 13 before the formation of the drain electrode 15 and the source electrode 16. After the formation of the drain electrode 15 and the source electrode 16, the interlayer insulating layer in its part located above the channel region is completely or partly removed. The interlayer insulating layer region to be removed is preferably equal to the size of the gate electrode 12.

Materials usable for the interlayer insulating layer include inorganic material such as $SiO_2$, SiNx, and $Al_2O_3$ and organic materials such as polychloropyrene, polyethylene terephthalate, polyoxymethylene, polyvinyl chloride, polyvinylidene fluoride, cyanoethylpullulan, polymethyl methacrylate, polysulfone, polycarbonate, and polyimide.

(Other Embodiments of Organic Semiconductor Device)

Examples of the construction of the organic semiconductor device according to the present invention include (i) substrate/gate electrode/gate insulating layer/source-drain electrode/organic semiconductor layer (/protective layer), (ii) substrate/gate electrode/gate insulating layer/organic semiconductor layer/source-drain electrode/(protective layer), (iii) substrate/gate electrode/gate insulating layer/organic semiconductor layer/substrate with source-drain electrode patterned therein (which functions also as protective layer), (iv) substrate/source-drain electrode/organic semiconductor layer/gate insulating layer/gate electrode/substrate (which functions also as protective layer), or (v) substrate/gate electrode/gate insulating layer/source-drain electrode/organic semiconductor layer/substrate. In the organic semiconductor device, the organic semiconductor layer can easily be formed by coating using the organic semiconductor material according to the present invention.

EXAMPLES

The following Examples further illustrate the present invention.

Example 1

An organic semiconductor material represented by chemical formula 2, wherein R1 and R2 represent a C12 identical straight chain alkyl group, and having a number average molecular weight of about 55,000 and a weight average molecular weight of about 99,000, was prepared.

<Synthesis of 2-dodecylthiophene>

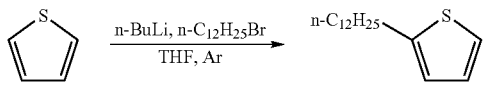

Thiophene (51.2 g, 623 mmol, 1.2 eq) was first placed in a three-necked flask equipped with a dropping funnel and a reflux tube. The atmosphere in the flask was replaced by Ar (argon), 200 ml of dehydrated tetrahydrofran (hereinafter referred to as "THF") was then added thereto, and the mixture was stirred. The reaction solution was cooled to −78° C., 2.6 M n-BuLi (200 ml, 520 mmol, 1.0 eq) was added dropwise to the cooled solution, and the mixture was stirred for 30 min. The reaction solution was brought to 0° C. and was stirred for 2 hr. Thereafter, the reaction solution was brought to room temperature and was stirred for 15 min, followed by cooling to 0° C. 1-Bromo-n-dodecane (130 g, 520 mmol, 1.0 eq) was added dropwise thereto, and the mixture was stirred at 0° C. for 2 hr. The reaction solution was brought to room temperature, was stirred for 6 hr, and was then refluxed for one hr. The reaction solution was allowed to cool to room temperature and was extracted with diethyl ether, followed by washing with water until pH=7. The extract was dehydrated over $Na_2SO_4$, and the solvent was then removed by evaporation. The residue was purified by chromatography on silica gel to give an objective substance 2-dodecylthiophene as a light yellow liquid (about 125 g yield about 95%). An NMR spectrum of the compound thus obtained was measured at room temperature with an NMR spectrometer (model JNM-LA400W, manufactured by Japan Electric Optical Laboratory). $^1$H-NMR (CDCl$_3$, TMS/ppm): 0.88 (t, 3H, J=6.83 Hz), 1.26 (m, 18H), 1.67 (m, 2H), 2.81 (t, 2H, J=7.32 Hz), 6.77 (d, 1H, J=3.42 Hz), 6.90 (dd, 1H, J=3.42 Hz, J=5.37 Hz), 7.09 (d, 1H, J=0.98 Hz, J=4.88 Hz).

<Synthesis of 2-bromo-5-dodecylthiophene>

2-Dodecylthiophene (100 g, 396 mmol, 1 eq) prepared above was placed in a three-necked flask equipped with a dropping funnel and a reflux tube. The atmosphere in the flask was replaced by Ar, 400 ml of dehydrated N,N-dimethylfolmamid (hereinafter referred to as "DMF") was added thereto, and the mixture was stirred. The reaction solution was cooled to 0° C., and N-bromosuccinimide (84.5 g, 475 mmol, 1.2 eq) dissolved in 120 ml of dehydrated DMF in a separate vessel was added dropwise to the reaction solution. After the completion of the dropwise addition, the mixture was stirred for one hr, was brought to room temperature, and was stirred for 6 hr. The solvent was removed by evaporation, and the residue was extracted with diethyl ether, followed by washing with water until pH=7. The extract was dehydrated over $Na_2SO_4$, and the solvent was removed by evaporation, and the residue was purified by chromatography on silica gel to give an objective substance 2-bromo-5-dodecylthiophene (about 118 g yield about 90%) as a light yellow liquid. An NMR spectrum of the compound thus obtained was measured at room temperature with an NMR spectrometer (model JNM-LA400W, manufactured by Japan Electric Optical Laboratory). $^1$H-NMR (CDCl$_3$, TMS/ppm): 0.88 (t, 3H, J=6.83 Hz), 1.26 (m, 18H), 1.62 (m, 2H), 2.73 (t, 2H, J=7.32 Hz), 6,53 (d, 2H, J=4.39 Hz), 6.84 (d, 2H, J=3.90 Hz).

<Synthesis of 5'-dodecyl-3,2'-bithiophene>

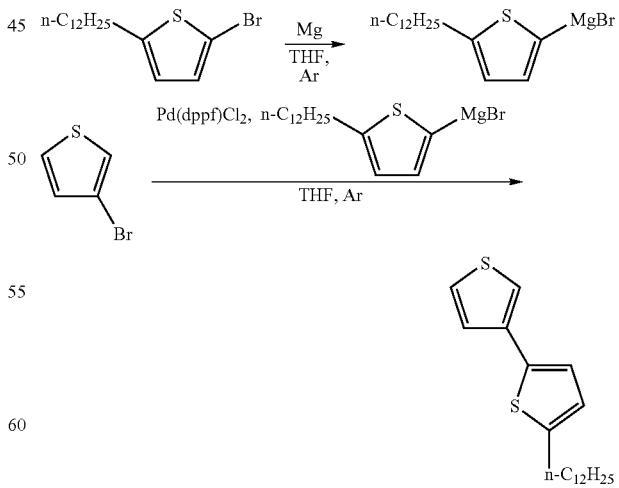

Granular magnesium (5.6 g, 232 mmol, 1.1 eq) was placed in a three-necked flask equipped with a dropping funnel and a reflux tube, and the atmosphere in the flask was replaced by Ar. A small amount of $I_2$ was added to the granular magnesium, and 20 ml of dehydrated THF was added thereto, followed by ultrasonication for 20 min. Dehydrated THF (200 ml) was added thereto, and the mixture was stirred. 2-Bromo-5-dodecylthiophene (70 g, 211 mmol, 1 eq) prepared above and dissolved in 100 ml of dehydrated THF in a separate vessel was added dropwise to the reaction solution. The mixture was refluxed for 3 hr and was allowed to cool to room temperature to prepare a Grignard reagent.

Separately, diphenylphosphinoferroceneparadium dichloride (hereinafter referred to as "Pd(dppf)Cl$_2$") (1.7 g, 2.11 mmol, 0.01 eq) and 3-bromothiophene (41.0 g, 253 mmol, 1.2 eq) were placed in a three-necked flask, and the atmosphere in the flask was replaced by Ar. Dehydrated THF (200 ml) was added to the contents of the flask, and the mixture was cooled to 0° C. The Grignard reagent prepared above was added dropwise thereto, and the mixture was stirred for 30 min. The reaction solution was brought to room temperature and was stirred for 6 hr. A 1 N aqueous HCl solution (20 ml) was added thereto, and the mixture was stirred for 15 min. THF was removed by evaporation, and the residue was extracted with diethyl ether, followed by washing with water until pH=7. The extract was dehydrated over Na$_2$SO$_4$, and the solvent was removed by evaporation, and the residue was purified by chromatography on silica gel and was recrystallized from ethanol to give an objective substance 5' dodecyl-3,2'-bithiophene as a light yellow solid (about 38.5 g, yield about 54%). An NMR spectrum of the compound thus obtained was measured at room temperature with an NMR spectrometer (model JNM-LA400W, manufactured by Japan Electric Optical Laboratory). $^1$H-NMR (d$_6$-DMSO, TMS/ppm): 0.86 (t, 3H, J=6.83 Hz), 1.26 (m, 18H), 1.64 (m, 2H), 2.77 (t, 2H, J=7.32 Hz), 6.75 (d, 1H, J=3.42 Hz), 7.11 (d, 1H J=3.42 Hz), 7.32 (dd, 1H, J=0.97 Hz, J=5.12 Hz), 7.53 (m, 2H).

<Synthesis of 2-bromo-5'-dodecyl-3,2'-bithiophene>

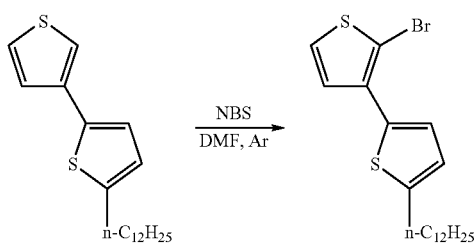

5'-Dodecyl-3,2'-bithiophene (34.5 g, 103 mmol, 1 eq) prepared above was placed in a three-necked flask equipped with a dropping funnel and a reflux tube. The atmosphere in the flask was replaced by Ar, 500 ml of dehydrated DMF was added thereto, and the mixture was stirred. The reaction solution was cooled to 0° C., and N-bromosuccinimide (19.2 g, 108 mmol, 1.05 eq) dissolved in 100 ml of dehydrated DMF in a separate vessel was added dropwise to the reaction solution. After the completion of the dropwise addition, the mixture was stirred for one hr, was brought to room temperature, and was stirred for 6 hr. The solvent was removed by evaporation, and the residue was extracted with diethyl ether, followed by washing with water until pH=7. The extract was dehydrated over Na$_2$SO$_4$, the solvent was removed by evaporation, and the residue was purified by chromatography on silica gel to give an objective substance 2-bromo-5'-dodecyl-3,2'-bithiophene as a light yellow liquid (which solidified a few hours after that) (about 41.5 g, yield about 97%). An NMR spectrum of the compound thus obtained was measured at room temperature with an NMR spectrometer (model JNM-LA400W, manufactured by Japan Electric Optical Laboratory). $^1$H-NMR (d$_6$-DMSO, TMS/ppm): 0.86 (t, 3H, J=6.83 Hz), 1.26 (m, 18H), 1.66 (m, 2H), 2.80 (t, 2H, J=7.32 Hz), 6.83 (d, 1H, J=2.93 Hz), 7.22 (d, 1H, J=5.34 Hz), 7.32 (d, 1H, J=3.90 Hz), 7.59 (d, 1H, J=5.37 Hz).

<Synthesis of Monomer Precursor>

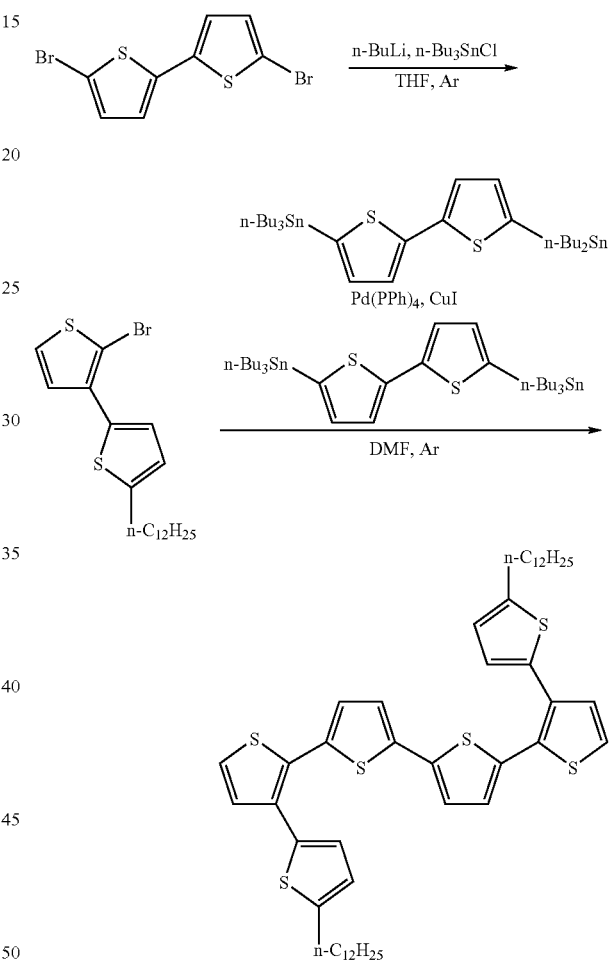

5,5'-Dibromo-2,2'-bithiophene (14 g, 43 mmol, 1 eq) was placed in a three-necked flask equipped with a dropping funnel and a reflux tube, and the atmosphere in the flask was replaced by Ar. Dehydrated THF (400 ml) was added thereto, and the mixture was stirred for dissolution. The solution was cooled to −78° C., and about 61 ml (95 mmol, 2.2 eq) of n-BuLi (1.58 M) was added dropwise to the cooled solution. The mixture was stirred for 30 min, was then brought to 0° C., and was further stirred for 2 hr. The temperature of the reaction solution was returned to room temperature before the reaction solution was stirred for 15 min and was cooled to 0° C. Sn(n-Bu)$_3$Cl (33.9 g, 104 mmol, 2.4 eq) was added dropwise thereto, and the mixture was stirred for 2 hr. The temperature of the reaction solution was returned to room temperature before the reaction solution was stirred for 6 hr. The reaction mixture was refluxed for one hr, and the solvent was removed by evaporation. The residue was subjected to column chromatography on silica gel for placing point removal to give about 32.1 g of a tin compound synthesizing reagent as an orange liquid.

Separately, Pd(PPh$_3$)4 (1.0 g, 0.87 mmol, 0.02 eq) and CuI (0.58 g, 3.0 mmol, 0.07 eq) were placed in a vessel, and the atmosphere in the vessel was replaced by Ar. Dehydrated DMF (300 ml) was added thereto, and the mixture was stirred. The tin compound synthesizing reagent (32.1 g) and 2-bromo-5'-dodecyl-3,2'-bithiophene (41.5 g, 100 mmol, 2.3 eq) prepared above were added thereto. Dehydrated DMF (300 ml) was then added, and the mixture was heated to 120° C. and was stirred at that temperature for 3 hr. The solvent was removed by evaporation, and the residue was extracted with chloroform, followed by washing with water until pH=7. The extract was dehydrated over Na$_2$SO$_4$, and the solvent was removed by evaporation, and the residue was purified by chromatography on silica gel and was recrystallized from ethanol to give a monomer precursor as an objective substance (yellow solid, about 24.8 g, yield about 69.0%). An NMR spectrum of the compound thus obtained was measured at room temperature with an NMR spectrometer (model JNM-LA400W, manufactured by Japan Electric Optical Laboratory). $^1$H-NMR (d$_6$-DMSO, TMS/ppm): 0.83 (t, 6H, J=6.83 Hz), 1.22 (m, 36H), 1.60 (m, 4H), 2.75 (t, 4H, J=7.32 Hz), 6.75 (d, 2H, J=3.42 Hz), 6.96 (d, 2H, J=3.90 Hz), 7.08 (d, 2H, J=3.90 Hz), 7.17 (m, 4H), 7.56 (d, 2H, J=5.37 Hz).

<Synthesis of Monomer>

The monomer precursor (8.0 g, 9.6 mmol, 1 eq) prepared above was placed in a three-necked flask equipped with a dropping funnel and a reflux tube. The atmosphere in the flask was replaced by Ar, 500 ml of hydrated DMF was added thereto, and the mixture was stirred. N-Bromosuccinimide (3.5 g, 19.7 mmol, 2.05 eq) dissolved in 100 ml of dehydrated DMF in a separate vessel was added dropwise to the reaction solution. The mixture was heated to 70° C. and was stirred for 6 hr. The solvent was removed by evaporation, and the residue was extracted with chloroform, followed by washing with water until pH=7. The extract was dehydrated over Na$_2$SO$_4$, and the solvent was removed by evaporation. The residue was purified by chromatography on silica gel and was recrystallized from butyl acetate to give a monomer as an objective substance (yellow solid, about 5 g, yield about 52.6%). An NMR spectrum of the compound thus obtained was measured at room temperature with an NMR spectrometer (model JNM-LA400W, manufactured by Japan Electric Optical Laboratory). $^1$H-NMR (d$_6$-DMSO, TMS/ppm): 0.84 (t, 6H, J=6.83 Hz), 1.21 (m, 36H), 1.58 (m, 4H), 2.75 (t, 4H, J=7.32 Hz), 6.76 (d, 2H, J=3.42 Hz), 7.00 (d, 2H, J=3.42 Hz), 7.11 (d, 2H, J=3.42 Hz), 7.19 (d, 2H, J=3.92 Hz), 7.32 (s, 2H).

<Polymerization>

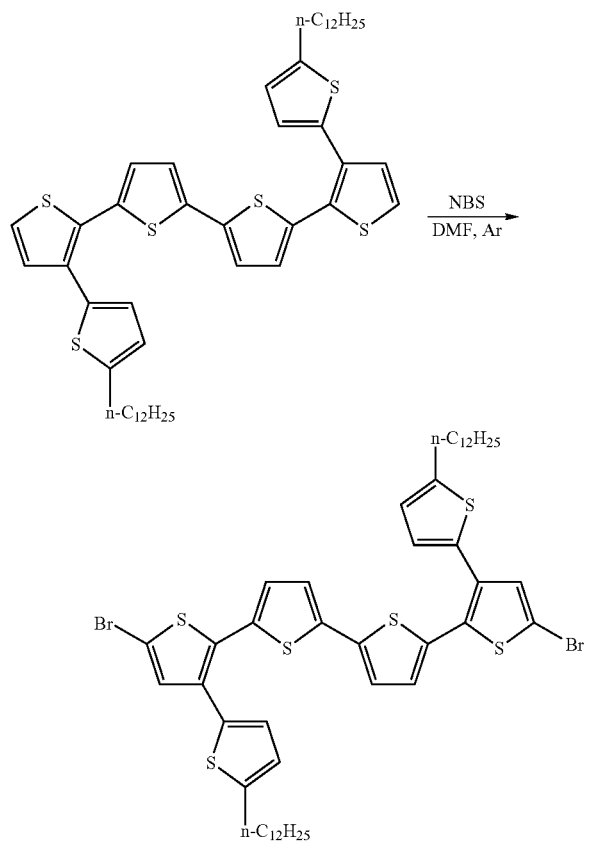

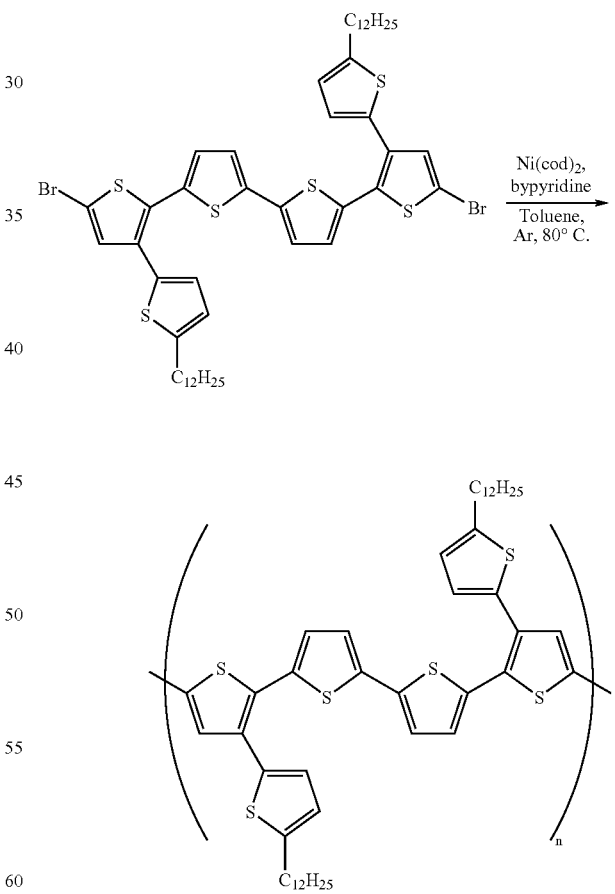

The monomer prepared above (1.53 g, 1.5 mmol, 1 eq) and bypyridine (0.34 g, 2.1 mmol, 1.35 eq) were placed in a 100-ml Schienk tube, and the Schienk tube was placed in a glove box filled with nitrogen. Ni(cod)2 (0.57 g, 2.0 mmol, 1.3 eq) was added to the contents of the Schlenk tube, and a reflux tube and a three-way cock were mounted on the Schlenk tube, followed by hermetical sealing. The assembly was taken out of the glove box, and the atmosphere in the Schlenk tube was replaced by Ar. Dehydrated toluene (20 ml) was added thereto, and the mixture was stirred, was refluxed for 4 hr, and was stirred at room temperature overnight. The reaction solution was then refluxed for 6 hr and was monitored by TLC (thin layer chromatography) and high performance GPC (high performance GPC apparatus HLC-8020, manufactured by Tosoh Corporation). After the confirmation that the monomer substantially disappeared, the reaction solution was allowed to cool.

This reaction solution was added to 500 ml of 5 wt % HCl-methanol, and the mixture was filtered. Toluene (100 ml) was added to the black solid thus obtained, and the mixture was heated for dissolution. The solution was filtered through a small amount of Celite (registered trademark of Celite, USA). The solvent was removed from the filtrate by evaporation, 50 ml of toluene was added to the residue, and the mixture was heated for dissolution, followed by recrystallization from 500 ml of 5 wt % HCl-methanol. The resultant crystal was collected by filtration and was dried in vacuo. This product was stirred in 300 ml of a 7 wt % aqueous disodium ethylenediaminetetraaceate (EDTA2Na) solution at 70° C. for 30 min. After washing with hot water, washing with methanol was carried out. Toluene (100 ml) was added, and the mixture was heated for dissolution. The solution was filtered through Celite (registered trademark of Celite, USA). The solvent was removed from the filtrate by evaporation, 50 ml of toluene was added to the residue, and the mixture was heated for dissolution, followed by recrystallization from 500 ml of 5 wt % HCl-methanol. The resultant crystal was washed with methanol and was dried in vacuo to give 0.8 g of a black fibrous solid. The black fibrous solid was subjected to GPC measurement. As a result, a peak of Mw: 99,000 (Mw/Mn 2.2) in terms of polystyrene was obtained. In this Example, all of toluene and methanol used for the purification were EL standard products.

<Preparation of FET Element>

A wafer purchased from ELECTRONICS AND MATERIALS CORPORATION LIMITED was used in a test device. This wafer is an n-doped silicon wafer with a silicon oxide layer having a thickness of about 3000 angstroms (300 nm) thermally produced thereon. The wafer functioned as a gate electrode while the silicon oxide layer functioned as a gate dielectric material, and the electrostatic capacitance was about 11 nF/cm$^2$ (nanofarad/square centimeter). This wafer was immersed in a 0.1 M dehydrated toluene solution of phenyltrichlorosilane at 60° C. for 20 min. Next, this wafer was washed with toluene, and the remaining liquid was removed by a nitrogen air gun, followed by drying at 100° C. for one hr.

Next, gold source and drain electrodes were vacuum deposited onto the silicon oxide dielectric layer through a shadow mask with varied channel length and width. Thus, a series of transistor electrodes having various sizes were prepared. Thereafter, this wafer was heated to 100° C., and an organic semiconductor layer was formed by spin coating at a solution temperature of 100° C. at a speed of 2000 rpm for about 10 sec. The solution for the formation of the organic semiconductor layer was a 1.0 wt % polymer solution of the polymer (compound name: poly[3,3'''-bis(5-dodecyl-2-thienyl)-2,2':5',2'':5'',2'''-quarterthiophene]) prepared above and dissolved in tetralin. These procedures were carried out under ambient conditions, and any measure for preventing the exposure of the material and apparatus to ambient oxygen, moisture, or light was not taken.

Figure 3:
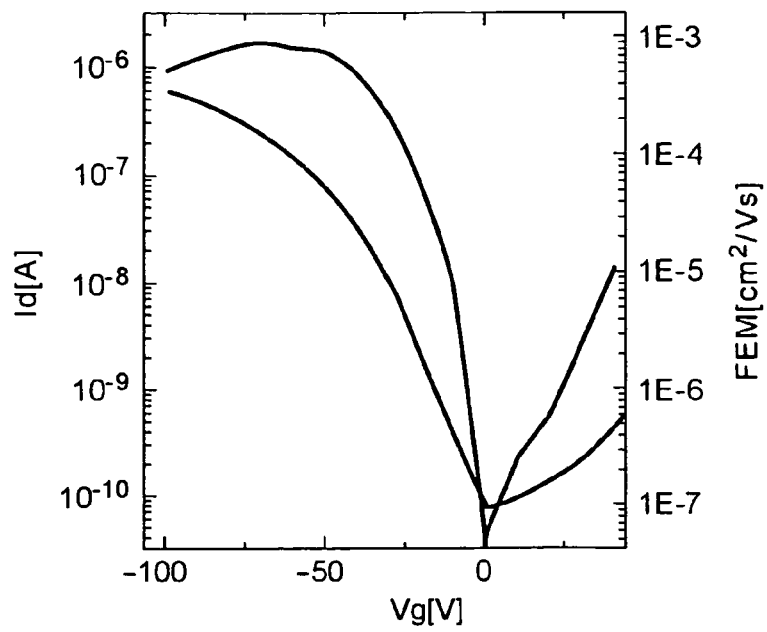
FIG. 3 is a graph showing transfer characteristics of an FET element with an organic semiconductor layer formed therein.
Figure 4:
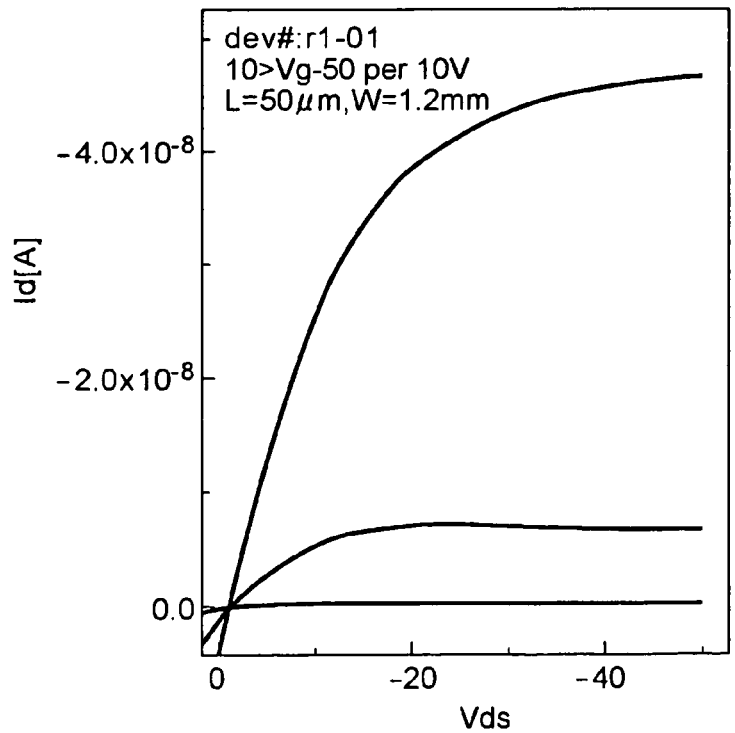
FIG. 4 is a graph showing output characteristics of an FET element with an organic semiconductor layer formed therein.

FET properties were evaluated by 237 HIGH VOLTAGE SOURCE MEASURE UNIT, manufactured by KEITHLEY. FIGS. 3 and 4 are graphs showing transfer characteristics and output characteristics of the FET element thus obtained. The carrier mobility (μ) was calculated based on data in a saturation region (gate voltage $V_G$<source-drain voltage $V_{SD}$) by the following equation (1). In equation (1), $I_{SD}$ represents drain current in the saturation region, W and L represent the width and length in the semiconductor channel, respectively, $C_i$ represents the electrostatic capacitance per unit area of the gate dielectric layer, and $V_G$ and $V_T$ represent gate voltage and threshold voltage, respectively. $V_T$ in this apparatus was determined from the relationship between the square root of $I_{SD}$ in the saturation region and $V_G$ in the apparatus determined from the measured data by extrapolating $I_{SD}$=0. The current on/off ratio is the ratio between saturation source/drain current at a gate voltage $V_G$ equal to or higher than the drain voltage $V_D$, and source/drain current at a gate voltage $V_G$ of zero.

$$I_{SD}=C_i\mu(W/2L)(V_G-V_T)^2 \qquad (1)$$

The average property value obtained from five or more transistors having a size of W (width)=1200 μm and L (length)=50 μm was hole mobility=1×10$^{-3}$ cm$^2$/Vs and current on/off ratio=10$^4$ (Vds=−80V). This high on/off ratio suggests that the polymer material is less likely to undergo oxidation and thus is highly stable in the atmosphere and exhibits good process properties.

Example 2

In Example 2, the effect of reducing ionization potential of the organic semiconductor material according to the present invention and the extension effect of the π conjugated system were studied. Stereoregular poly(3-hexylthiophene) which comprises thiophene as a main chain part and has high planarity (hereinafter referred to as "P3HT") was used as a comparative material (see chemical formula a). This P3HT is known to have high semiconductor characteristics, but on the other hand, the stability in the air is so low that suitability for process is low, that is, the preparation of good transistor is difficult. A commercially available product of Merck was used as the P3HT.

<Ionization Potential>

P3HT and the polymer material (name of compound: poly [3,3'''-bis(5-dodecyl-2-thienyl)-2,2':5',2'':5'',2'''-quaterthiophene], a compound represented by chemical formula 2 wherein R1 and R2 represent a straight chain alkyl group represented by —$C_{12}H_{25}$) according to the present invention were dissolved in toluene, and the solution was spin coated onto a glass substrate. This assembly was used as a sample and was measured for ionization potential. An atmospheric photoelectron spectroscopic device (AC-1) manufactured by RIKEN KEIKI CO., LTD was used for the measurement of the ionization potential. The ionization potential was −4.57 eV for P3HT and was −4.70 eV for the polymer material according to the present invention. This effect is considered attributable to loss of the planarity of the main chain part by steric hindrance by the aromatic ring located in the side chain part. The ionization potential is defined as the magnitude of energy necessary for taking out one electron from a substance. The above results show that, since the ionization potential value of P3HT is close to 0 (zero), the energy necessary for P3HT to take out one electron is lower than the energy necessary for the polymer material according to the present invention to take out one electron. Accordingly, it can be said that the polymer material according to the present invention is less likely to undergo oxidation as compared with P3HT.

<Extension of π Conjugated System>

In the same manner as described above, P3HT and the polymer material (name of compound: poly[3,3'''-bis(5-dodecyl-2-thienyl)-2,2':5',2":5",2'''-quaterthiophene], a compound represented by chemical formula 2 wherein R1 and R2 represent a straight chain alkyl group represented by —$C_{12}H_{25}$) according to the present invention were dissolved in toluene, and the solution was measured for maximum absorption wavelength with a spectrophotometer for ultraviolet and visible region (UV-2550) manufactured by ShimadzuSeisakusho Ltd. As a result, it was found that the maximum absorption wavelength was 453 nm for P3HT and was on longer wavelength side, i.e., 477 nm, for the polymer material according to the present invention. The maximum absorption wavelength on longer wavelength side means that the π conjugated system is wide, that is, the band gap has been narrowed. This suggests that the polymer material according to the present invention in which the planarity of the main chain part being disintegrated due to the presence of the aromatic ring located in the side chain part has π conjugated system extension effect.

The invention claimed is:

1. An organic semiconductor material comprising a structure represented by chemical formula 2, wherein R1 and R2 represent an alkyl group having 4 to 20 carbon atoms, and wherein said organic semiconductor material has a number average molecular weight of about 2,000 to about 200,000:

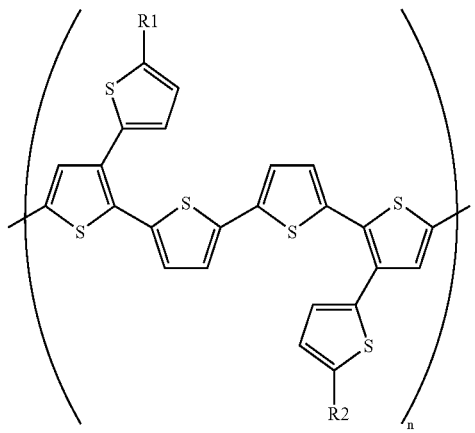

2. An organic semiconductor structure comprising an organic semiconductor layer comprising an organic semiconductor material according to claim 1.

3. An organic transistor comprising an organic semiconductor structure according to claim 2.

4. An organic EL element comprising an organic semiconductor structure according to claim 2.

5. An organic electronic device comprising an organic semiconductor structure according to claim 2.

6. An organic solar cell comprising an organic semiconductor structure according to claim 2.

7. An organic semiconductor device comprising at least a substrate, a gate electrode, a gate insulating layer, an organic semiconductor layer, a drain electrode, and a source electrode, said organic semiconductor layer comprising an organic semiconductor material according to claim 1.

* * * * *